United States Patent [19]

Rasp et al.

[11] Patent Number: 5,516,028
[45] Date of Patent: May 14, 1996

[54] PROCESS AND SYSTEM FOR TEMPERATURE CONTROL AND IN-LINE TESTING OF ELECTRONIC, ELECTROMECHANICAL AND MECHANICAL MODULES

[76] Inventors: Richard A. Rasp, Horberstr. 21, 72336 Balingen; Bernd Johannsen, Odenwaldstr. 7B, 93057 Regensburg, both of Germany

[21] Appl. No.: 337,192

[22] Filed: Nov. 7, 1994

[30] Foreign Application Priority Data

Nov. 10, 1993 [DE] Germany ............... 43 38 445.5

[51] Int. Cl.$^6$ ............... B23K 31/12; B23K 37/00
[52] U.S. Cl. ............... 228/104; 228/56.5; 228/103; 209/573
[58] Field of Search ............... 228/102, 103, 228/56.5, 104; 209/573

[56] References Cited

U.S. PATENT DOCUMENTS

| | | |
|---|---|---|
| 4,607,220 | 8/1986 | Hollman . |
| 4,818,933 | 4/1989 | Kerschner et al. . |
| 4,926,118 | 5/1990 | O'Connor et al. . |
| 4,993,136 | 2/1991 | Kerschner et al. . |
| 5,055,779 | 10/1991 | Kerschner et al. . |
| 5,246,291 | 9/1993 | Lebeau ............... 228/104 |
| 5,321,885 | 6/1994 | Hind et al. ............... 209/573 |
| 5,325,582 | 7/1994 | Glaser et al. ............... 209/573 |

FOREIGN PATENT DOCUMENTS

| | | |
|---|---|---|
| 0164563 | 12/1985 | European Pat. Off. . |
| 8304116 U | 4/1984 | Germany . |
| 3721653 | 2/1988 | Germany . |

OTHER PUBLICATIONS

Test & Measurement World, vol. 14, No. 5, Apr. 1994, p. 93, "Environmental Test Equipment System Makes Continuous Process of Environmental Screening".

IBM Technical Disclosure Bulletin, vol. 34, No. 7B, Dec. 1991, "Guardbanding Card Assemblies Within the Manufacturing Line", pp. 343–344.

Primary Examiner—P. Austin Bradley
Assistant Examiner—Jeffrey T. Knapp
Attorney, Agent, or Firm—Oblon, Spivak, McClelland, Maier & Neustadt

[57] ABSTRACT

A process and system exists for temperature control and testing of modules, such as printed circuit boards, with fitted electronic, electromechanical and mechanical components or individual components, wherein the modules are subjected, following assembly in a soldering process and when the solder joints are still in a semi-molten state, to one or more test phases at high and low temperature, in order to detect defects at an early stage and to take immediate corrective measures when errors occur. To this end, in a first test phase the modules are cooled, as they emerge from the soldering process, to a temperature ranging from 40° to 125° C. and tested in a first test phase. Thereafter, in a second test phase the modules are cooled to a temperature ranging from −40° to 10° C. and tested. In the respective test phase the modules are subjected to a component and/or function test in order to determine defective modules. Modules that are found to be faultless are then fed to a dispenser, whereas defective modules are sorted out from the path to the dispenser and an error message is sent. To improve the error inspection, the modules are provided with a digital code that can be read prior to the respective test phase, so that management of defective and faultless modules is possible with digital computers.

19 Claims, 6 Drawing Sheets

PROCESS AND SYSTEM FOR TEMPERATURE CONTROL AND IN-LINE TESTING OF ELECTRONIC, ELECTROMECHANICAL AND MECHANICAL MODULES

BACKGROUND OF THE INVENTION

1. Field of the Invention

This invention relates to a process and system for temperature control and in-line testing of electronic, electromechanical or mechanical modules with the components fitted as semi-finished products, in particular printed circuit boards, which leave in succession a soldering station and, following temperature control in a test phase, are connected electrically or optically to at least one electric or optic testing device by means of an adapter unit and are tested by means of the testing device.

2. Discussion of Background

A system for handling and testing printed circuit boards with the electric or electronic components fitted is known from U.S. Pat. No. 4,818,933, where the printed circuit boards are tested in devices with respect to the correct positioning and orientation of the components fitted and with respect to the function prior to their final installation. The system exhibits a supporting frame, which contains at least one adapter plate for contacting printed circuit board contacts, and orientation devices and locking devices and conveyor for feeding in and carrying away the printed circuit boards to be tested. The essential feature in this system is that, during the testing process, the next printed circuit board can already be fed in and stopped.

Furthermore, an integrated printed circuit board testing system is described in the U.S. Pat. No. 5,055,779, where the conversion of a conventional vacuum test system into a mechanical test system is described. The use of such test systems for testing printed circuit boards at high temperatures or low temperatures has been demonstrated to be a problem, since the appropriate test electronics is attached directly to the adapter in order to scan the test points on the pc boards, and an ambient temperature of 100° C., as required for a high temperature test for printed circuit boards, would also increase, for example, the operating temperature of the test equipment and thus possibly impair its proper operation.

A test console with a chamber, in which test pc boards for electronic components are arranged, is known from the DE-GM 83 04 116. In the test chamber it is determined whether or not the test pc board fails under the specified test conditions, such as temperature; if special sealing measures for the test chambers are used, a plurality of electric contacts between the selected pc board of the test device and the test pc boards is to be produced in a minimum of space within the console.

Furthermore, test equipment including a furnace chamber for testing electric components arranged on printed circuit boards is known from the DE-PS 37 21 653, wherein the walls, floor or cover have one slot or multiple slots with temperature resistant sealing lips that are attached to both sides of the longitudinal sides of the slot and through which parts of the supporting plates can be pushed. The sealing lips are formed by two sluice-shaped sealing profiles of a cross section that is, for example, U-shaped, where the profiles rest flat in the center of the slot.

Furthermore, a device for testing single electronic components, such as integrated circuits, is known from U.S. Pat. No. 4,607,220, wherein the-test conditions are conducted in a wide temperature range of −65° to +150° C., for example.

The problem with the known temperature control and test equipment has proven to be the batch loading of the furnaces or consoles or test equipment, so that a function test is not possible between the production steps or temperature control phases; and the final test of the modules cannot take place until said modules are finished; i.e., complete assembly with their external connecting configuration.

SUMMARY OF THE INVENTION

Accordingly, the objects of this invention are to provide a novel method and system for temperature control and testing of electronic, electromechanical or mechanical modules, with component elements fitted as semi-finished products, in particular printed circuit boards, wherein the printed circuit boards are subjected to at least one test phase at high and/or at low temperature, for example, by means of an in-circuit tester (ICT) or a functional tester, in a range of −50° to 200° C., immediately following a soldering process as the printed circuit boards emerge from the soldering station, and wherein determined module defects immediately trigger correction measures, thereby to eliminate quickly systemic errors in the preceding production steps so that large numbers of defective modules can be avoided and so that the supplied energy shall be optimally utilized. In one embodiment, the number of defective printed circuit boards in a defined time interval is determined, and when the number exceeds a set number, temperature testing is suspended and corrective measures are taken in the processing stations upstream of the testing station, such as in a printer, a pick-and-place machine and a soldering station. In this way the present invention avoids producing of additional defective printed circuit boards until the source of the defect is located and corrected.

Furthermore, the present invention permits the use of computer directed process controlled production facilities, so that extensive automation of the production and temperature control/test process of the electronic printed circuit boards can be obtained. Moreover, owing to the thermal stresses conducted between the individual production steps, the production steps, preceding the respective function test are checked for their parameters that are effective for the reliability with a subsequent function test, so that a fast correction of the production parameters and thus a lower failure rate of semi-finished products can be obtained.

One important advantage of the invention lies in the fact that owing to the fast recognition of defective production steps, a continuous optimization of the individual components or the entire production sequence is possible, thus enabling an immediate sorting out of defective modules with subsequent repair. In addition it has proven to be advantageous to control the known errors or too high error tolerances for optimizing the parameters of the preceding production steps, whereby, for example, open soldering points or defective orientations of the components can be remedied by refeeding a defective semi-finished product.

In an advantageous embodiment the system of the present invention is constructed in modules, so that the individual modules can be rapidly interchanged or replaced. In another embodiment it is possible to divide the conveyor into device modules or individual modules with individual drive.

The modular construction of the system according to the invention has proven to be advantageous, since the production process can be divided into multiple single steps, with the result that energy can be saved owing to the functional interaction of the modules, which are in themselves separated, within a closed system.

Another advantage lies in the fact that a process sequence, which is predetermined schematically, can be modified in a simple manner by removing individual modules from the modularly constructed system and exchanging or replacing with other modules. The ease with which the system can be serviced is dramatically improved by the easy accessibility of the individual modules; thus, the maintainability of the device is facilitated.

Another advantage lies in the automatability through use of coded modules and decoders within the system, since in this manner a relatively straight-forward management of the modules and automatable quality control is possible with the aid of a central computer and a traceability with respect to quality standard (ISO 9000) is a given. Dedicated coding for each printed circuit board facilitates keeping track of the test history of each printed circuit board so that if a printed circuit board fails a predetermined number of tests, it is then scrapped without further attempts at repair.

Another advantage lies in the fact that after the printed circuit boards leave the soldering device in the first test phase, they can always be maintained and used with all components at the same temperature level by means of convection of heat from the printed circuit boards themselves, which already are at a high temperature as they emerge from the soldering station. Thus energy consumption for temperature testing is reduced.

Another advantage can be seen in the fact that the conveyance of modules can be operated with continuous or clocked movement by means of a modular conveyor or also in combination optionally with additional acceleration, in order to avoid no-load movements for the sake of saving energy and to increase the reliability; in addition, the passage time of the modules is reduced.

Furthermore, it is possible to provide by means of a central computer an automatable change in width and optionally a central support of the transport frame, so that a flexible production program of differently formatted modules or printed circuit boards can travel through the system according to the invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1a is a diagrammatic top view of the device according to the invention together with a preceding assembly device and soldering station, both of which are shown symbolically, whereas FIG. 1b depicts the temperature profile of the module according to FIG. 1a along the axis of conveyance X.

DESCRIPTION OF THE PREFERRED EMBODIMENTS

Referring now to the drawings, wherein like reference numerals designate identical or corresponding parts throughout the several views, and more particularly to FIGS. 1a and 1b thereof, according to FIGS. 1a and 1b, the printed circuit board, shown schematically here as module 1, leaves the symbolically illustrated pick-and-place machine 2 along the conveying direction X and is fed subsequently to the soldering station 3, which is also illustrated symbolically and in which, according to FIG. 1b, the temperature is raised to a value as far as exceeding 240° C., in order to obtain proper soldering of the printed circuit board as a module to the components fitted. After leaving the soldering station 3, the printed circuit board 1 passes through a temperature control area 4 where the temperature of the printed circuit board 1 is reduced to a range between 70° to 125° C. The printed circuit board leaves the temperature control area 4 through the closable gate 5 and enters by means of the conveyor 6 and by way of buffer region 7 the first test area 8. The buffer region 7 serves to uncouple between the soldering station and the entry region of the first test area 8, whereby printed circuit boards that may or may not have been repaired can also be fed in via the buffer region for the purpose of going through the testing process. The test area 8 and the preceding buffer region 7 contain an atmosphere in the nominal temperature range of +70° to +125° C. This atmosphere is protected from external atmosphere by means of a thermal insulation. Preferably the internal atmosphere of the first test area 8 consists of air, whereby the temperature of the modules under test can be adjusted in a set point range of +60° to +130° C. to be specified as desired. However, it is also possible to use inert gas, i.e., nitrogen, for example. The first test area 8 is sealed with respect to heat and atmosphere at least to a high degree from the environment. The test area 8 is shaped like a continuous tunnel, where to carry the modules away from the buffer region 7 into the first test station 9 a fast running conveyor belt element 10 of the conveyor 6 is provided. The conveyor 6 is divided into device modules, which in turn can be subdivided into individual modules, for example, into conveyor belt elements. The conveying movement can be operated either continuously, in switched mode or combined optionally with continuous acceleration. The region of the conveyor belt element 10 has a position sensing system 73 and a scanning system 17, which serves to identify, log and sense the position of the modules that are fed in and which in turn are provided with a scannable code. Another fast conveyor belt element 11 is provided for conveying the modules away from the first test station 9 into a second test station 12. To convey the modules out of the test station 12, there is another conveyor belt element 13, which serves to carry the modules from the first test area 8 through the gate 14. A second buffer region 15, which is connected to the ambient atmosphere and thus serves to cool the modules upon leaving the first test area 8, follows the gate 14.

As in the region of the first conveyor belt element 10, the region of the conveyor belt element 16 that follows gate 14 has a scanning system 18, in order to control the module, following testing in the test area 8 for the purpose of further processing as a function of the test results. The recording and control processes are conducted in a central computer, which is connected to the scanning systems and the test devices and the controllers for the conveyor 6 and for the gates. The second buffer region 15 has, next to the conveyor 6 running in the X-direction, a sluice conveyor 19, which extends perpendicularly to the conveyor 6 and which sorts out via gate 20 defective modules, which are denoted here symbolically with reference number 21, from the second buffer region 15 in the Y direction for the purpose of removal.

The modules 22 that are determined to be faultless are carried away by means of a conveyor 6 via gate 23 into the second test area 74, which serves to test the modules at low temperature and is extensively insulated with respect to heat against the external atmosphere, just like the first test area. Following gate 23 is a conveyor belt element 24, which is divided into a fast, a slow and a fast running segment, whereby the region of the conveyor belt 24 has a dry air or dry gas inlet 26, through which any moisture of condensation can be removed from the modules. Following the conveyor belt element is the third test station 27, which, just like the test stations of the first test area, is equipped with an adapter for contacting the module to be tested. Following test station 27 is another conveyor belt element 28 of the conveyor 6, which guides the module in the conveying direction X to the gate 29, which defines the second test area 74 and from where, after passing the opened gate 29, it is guided into a sluice area 31, which is also provided with a dry air or dry gas inlet 32. After passing through the sluice area 31, the module is guided by means of conveyor belt element 33 through gate 34 into a recover-to-ambient section, and on into a heating and/or dispensing device 35, on whose end 36 there is another scanning system 37, which conveys the modules determined to be faultless in the X direction for further processing, whereas the modules detected as defective are sorted out in the Y direction.

Figures 1A, 1B:
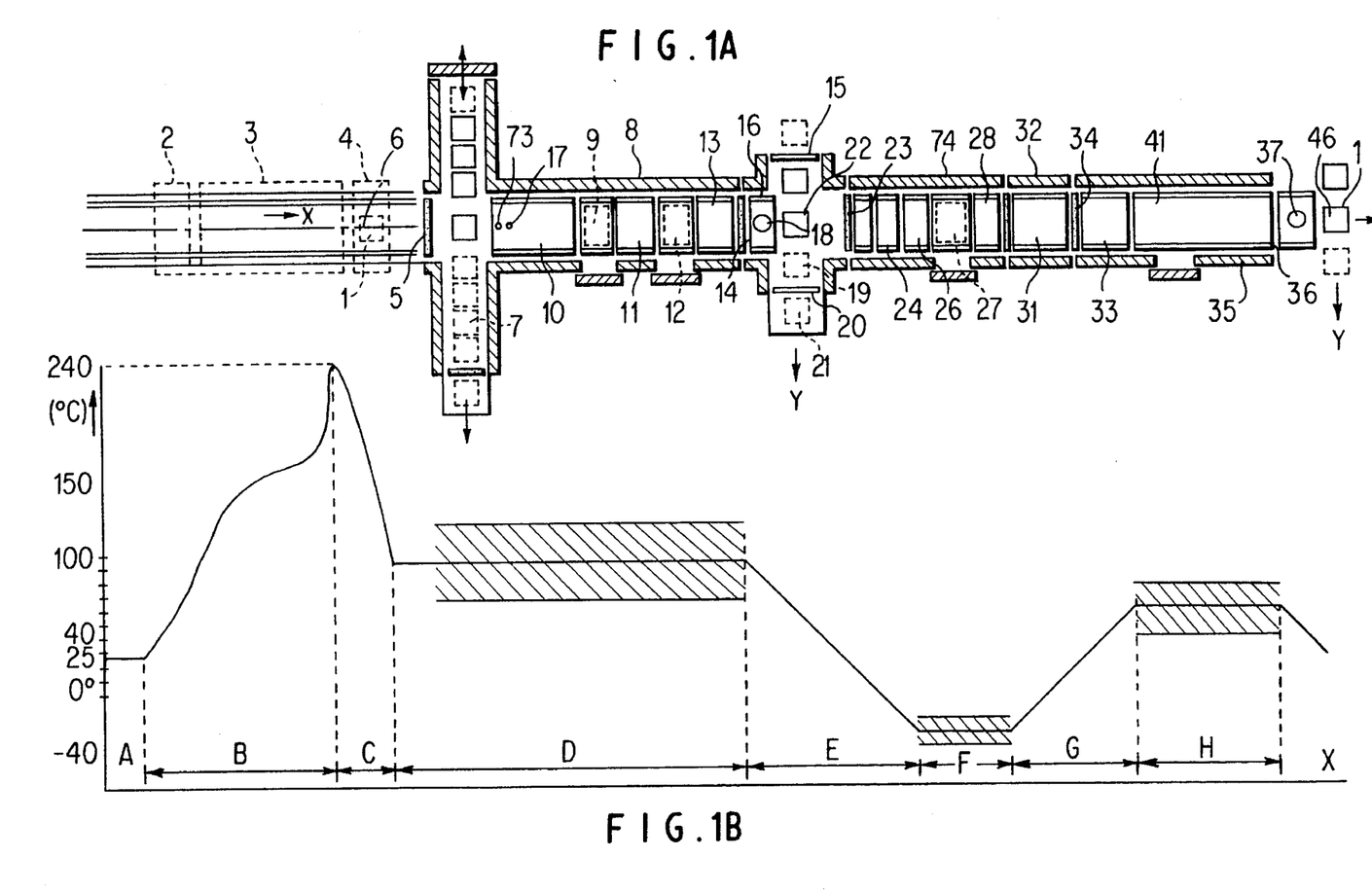

The temperature profile according to FIG. 1b is explained in the following with reference to the specification that defines the functions. The temperature profile is divided into temperature intervals A, B, C, D, E, F, G and H in accordance with the conveying direction X of FIG. 1a.

According to FIG. 1b, interval A represents the temperature in the pick-and-place machine 2, depicted only schematically according to FIG. 1a, whereas the adjacent temperature increase in interval B reproduces the temperature curve along the conveying direction, i.e. the X-axis in the reflow soldering station 3, shown schematically. Upon leaving the soldering station, the module, provided here schematically with reference numeral 1, passes through the cooling area 4, in which the temperature according to interval C drops from about 240° C. to 125° C., so that, when the module 1 enters into the first test station 9 through gate 5, the module 1 brings with it a relatively high temperature level with respect to the environment, so that only a small supply of energy is required for control purposes within the buffer region 7 and the adjoining first test area 8. Within the thermally insulated area formed by means of the buffer region 7 and first test area 8 the desired temperature value can be set in the range of 25° to 200° C.—preferably from +60° to +130° C. At the same time it is possible to feed inert gas, for example nitrogen, to this temperature control region formed by the buffer station and the test area, in order to prevent with certainty the module or the components fitted or their contacts from corroding. Upon leaving the buffer region 7, the module passes by means of conveyor belt element 10 through the scanning system 17, which logs the type and job number of the incoming module by means of a code found on the module and allocates the test result(s) to be expected to the corresponding job number. In the first test station 9 the module is subjected to a component or in-circuit test, whereby the individual components fitted and the conducting tracks of the module are tested.

Following completion of the incircuit test, the test result is assigned to the decoded job number, whereby a defective module is guided by means of the conveyor belt elements 11 and 13 without further testing from the test area 8 into the second buffer region 15 for the purpose of sorting out, whereas a module that has proven to be faultless is guided by means of the conveyor belt element 11 of the second test station 12 in order to conduct a function test of the entire printed circuit board. A module that is determined to be defective is in turn fed to the buffer region 15 via a conveyor belt element 13 and gate 14 for the purpose of sorting out of the buffer region 15, where the sorting out signal is assigned to the job number forwarded to the decoder 18 of the buffer region, and the defective module leaves the buffer region 15 for the purpose of sorting out at right angles to the conveying direction. A module that is recognized to be faultless is cooled to room temperature, according to the temperature profile of interval E, after passing through the decoder 18 in the buffer region 15, whereby a module that is found to be faultless is fed via gate 23 and conveyor belt element 24 to the third test station 27 for further function testing. The corresponding temperature curve with the drop from approximately 100° to approximately—40° C. and maintenance is shown in the intervals E and F. Upon leaving the test station 27, the module is conveyed by means of the conveyor belt element 28 through gate 29 from the second test area into the sluicing area 31, whereby the module conveyed on the conveyor belt element 33 is heated by means of dry air or gas inlet, whereby according to interval G of FIG. 1b the temperature rises above room temperature to approximately 40° C., and this temperature state is maintained in the heat treating phase of the recover to ambient section 41, until all of the moisture or moisture of condensation has evaporated. This interval is marked with the letter H in FIG. 1b. Upon leaving the recover-to-ambient section 41, the module is carried away in the X direction of the dispenser conveyor element 42 and detected by means of the decoder 43. If the modules are found to be faultless, they are carried away into the next production step or storage. If, however, a module is defective, the module found to be defective is sorted out of the dispenser 46 in the Y direction, with the result that it is carried away, for example by a sluice conveyor, as previously explained in regard to the buffer region 7 or buffer region 15.

Figure 2:
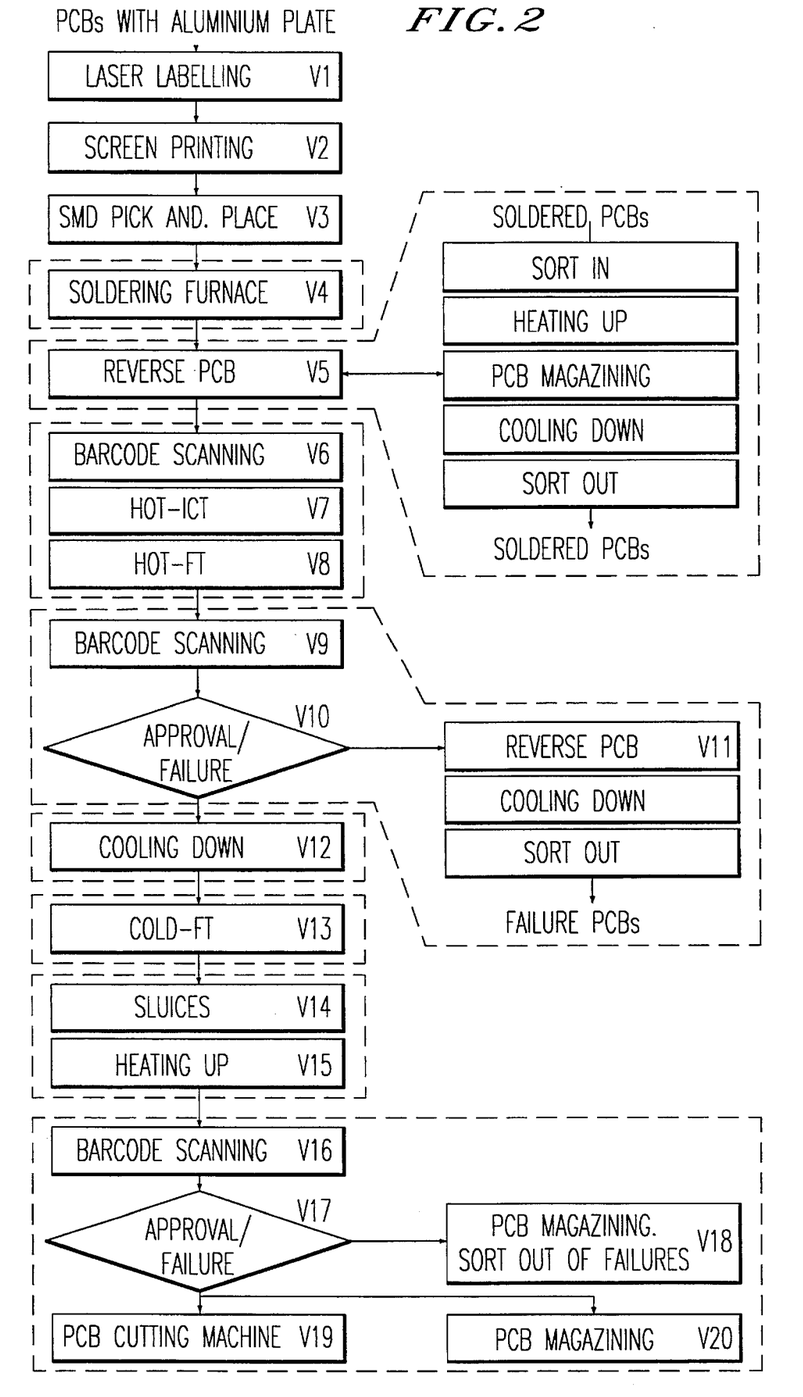
FIG. 2 is a flow diagram of the sequence control for a module guided thorough the system.

FIG. 2 depicts a flow diagram of the sequence control of the module in the process according to the invention, whereby the process steps V1–V3, such as laser labeling, screen printing and SMD pick and place do not belong to the actual subject matter of the process, but are incorporated for the sake of better comprehension.

According to FIG. 2, the modules with, for example, an aluminum plate or ceramic plate on the back side are identified through laser labeling, where, for example, an optical readable bar code is also-applied, in order to enable by means of a computer system a clear allocation of the module through optical scanning and its monitoring and/or recording. Furthermore, the configurations of the contact fields and conducting tracks in the process step V2 are applied, for example, by the screen printing method; and in the process step V3 the module is assembled with electronic, electromechanical or mechanical components. In the process step V4 the components fitted are connected electrically and mechanically through soldering, for example, in the soldering station, where subsequently in the process step 5 the temperature of the printed circuit board is controlled by heating or cooling, in order to maintain a specified test temperature.

Then in the process step V6 the fed-in module is optically scanned by means of bar code scanning, whereas in the process step V7 a high temperature component or in-circuit testing corresponding to the tests performed in the first test station 9 takes place; and in the process step V8 a high temperature function test corresponding to testing performed in the second test station 12 follows. The test results found in the process steps V7 or V8 are assigned to the module coding, which is determined and stored in step V6, whereby a poor test result determined in steps V7 or V8 results in the coded number, determined beforehand in step V6 being covered with the symbol "defective"; and after determining its coding in process step V9, the module is fed in accordance with the test result in process step V10 to process step V11 for the purpose of sorting out, or if the test result is in order, it is fed to process step V12 for the purpose of cooling, followed by a subsequent cold temperature test corresponding to the test performed in the third test station 27 in process step V13. Then in process step 14 the module is carried away via a sluice. In process step V15 the module is heated up again in order to allow, following the cooling process, the moisture of condensation to evaporate. In process step V16 the coding of the module is read out again and the module number is allocated to the test result of the cold test determined in the process step V13. In the process step V17 the decision is made whether the module should be sorted out as defective owing to a module defect in process step 18 or dispensed as a properly tested module for further processing or such as PCB cutting by a PCB cutting machine in step V19 or PCB magazining in step V20.

Figure 3A:
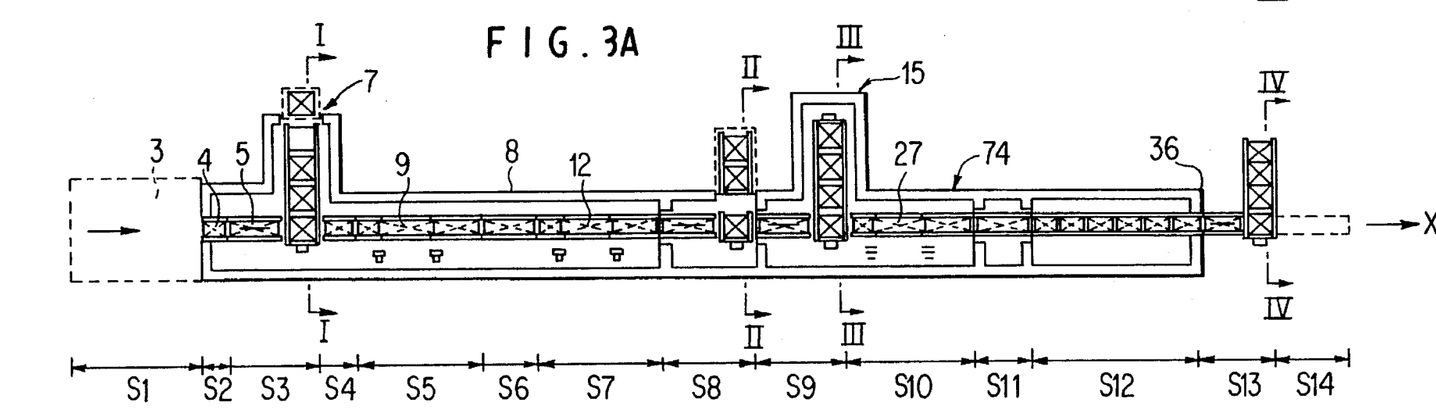
FIG. 3a is a fragmented top view of the system, suitable for modules or printed circuit boards whose width can be adjusted.

FIG. 3a shows the modular construction of the device, where for the sake of a better overview the individual stations constructed in modules are provided throughout with the labels S1 to S14. Elements of the device that have already been explained with reference to FIG. 1a are provided additionally with the reference numerals known from said FIG. 1a.

According to FIG. 3a, the modules travel, after leaving the soldering station S1, into the first temperature control area 4, comprising the separating-station S2, the buffer station S3, the scanning station S4, the first test station S5 and the reserved segment S6 for setting the switches in order to sort out defective modules S6 and the second test station S7. As explained above, the temperature in this first temperature control area can be set in a range between 25° to 200° C.

Upon leaving the station S7, all of the modules travel into an unregulated temperature region, where defective modules are sorted out of the testing process via the sorting out station S8, whereas modules tested as faultless are fed to the temperature control area with the cold profile unit S9. In this second temperature control area the modules are adjusted to a specified temperature ranging from −50° to +25° C. At the same time they are fed to the third testing station (inline test) S10 along the direction denoted as X and leave the second temperature control area via the sluice station S11, which is designed as a cold-hot-sluice and enter an uncontrolled temperature region. To prevent the formation of condensation water at room temperature and bring the modules back to room temperature, the modules are fed, moreover, to a third temperature control area with the station heat-profile S12, where the modules that are determined to be defective are sorted out of the path leading to the dispenser S14 via the second sorting out station S13.

According to the top view in FIG. 3a, it is also possible to process modules of different formats, whereby the variable width and center support of the module is done through automatic or manual adjustment of the chain drives or belt drives. According to FIG. 3a, the right sided belt or chain drives are mounted stationarily, as seen in the conveying direction X, whereas the left sided chain drive or belt drive elements and optionally a center support for the modules can be adjusted in the direction of the Y axis, which is plotted symbolically. With the aid of FIG. 3a, the buffer region 7 can be identified, as explained above with reference to FIG. 1, that forms together with the first buffer area 8 an insulated system that is largely sealed with respect to heat and optionally atmosphere against the environment. The modules that emerge from the soldering station enter, following a cooling phase, through gate 5 the buffer region 7, which forms together with the first test area a closed thermal system, where upon leaving the buffer region 7, the modules pass through a scanning system in order to determine and log the respective printed circuit board and then pass through the first test station 9 for the purpose of component testing and the second test station 12 for the purpose of function testing. The test results are allocated, as stated above, to the determined module numbers, whereby the defective modules are fed, upon leaving the first test area through gate 14, to the second buffer region 15, whereby the test results obtained in the test stations 9 and 12 are allocated to the respective module numbers; and the defective modules are sorted out in the second buffer region 15. The modules that are not defective are fed in the conveying direction X to the second test area with the third test station 27, whereby this station is thermally sealed against the environment for the purpose of cold testing and the modules can be fed to it only via gate 29 or carried away via gate 34.

According to the device described in FIG. 3a, it is also possible to decode the module formats in the scanning system and to adjust the width of the modules by means of a central computer and final controlling element in order to adjust the width of the conveyor belts or conveyor chains and optionally support the center automatically or manually, provided the formatting of the modules can be recognized from the coding.

Figure 3B:
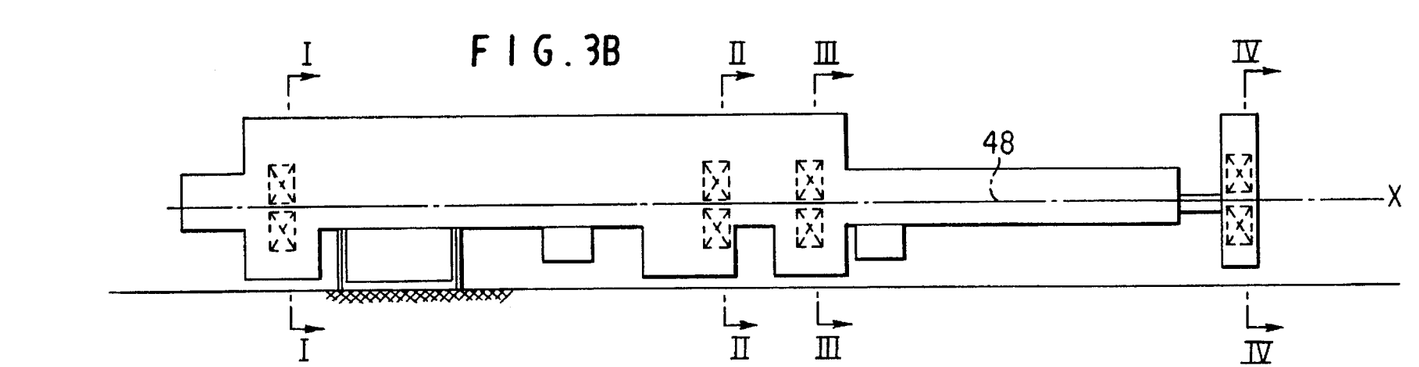
FIG. 3b is a diagrammatic front view of the system according to FIG. 3a, wherein FIGS. 3c to 3f reproduce respective sections at different points according to FIG. 3b.
Figure 3C:
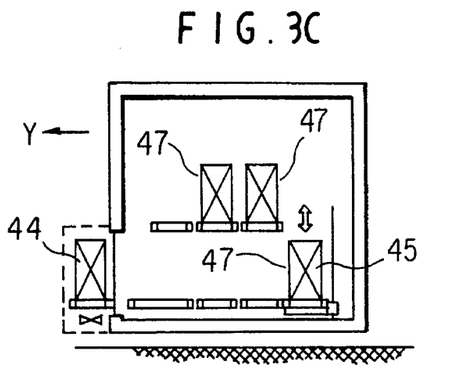
Figure 3D:
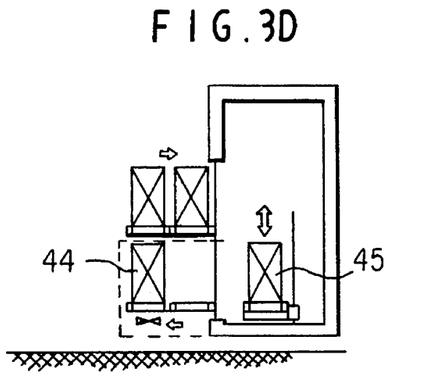
Figure 3E:
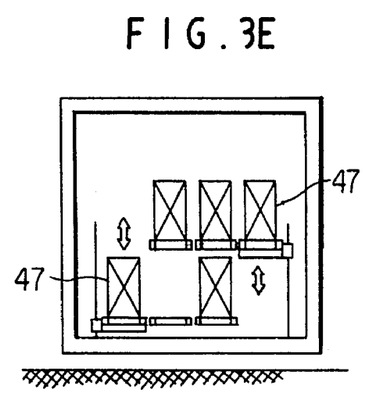

FIG. 3b is a profile section of the module conveying level 48 and the associated buffer regions and test stations along the conveying direction X. Furthermore, FIG. 3b shows the sections I—I, II—II, III—III and IV—IV, which are respectively depicted in the sectional FIGS. 3c, 3d, 3e and 3f. It is apparent from FIG. 3c that the module 45 is in a magazine 47, whose right side edge rests on the right conveyor chain or the right conveyor belt, whereas the left part of the module is situated in a magazine 47 on a conveyor chain or conveyor belt having variable adjustment in the Y direction. The feeding in or carrying away of defective modules is shown symbolically by means of module 44. The upper portion of FIG. 3c shows the empty magazines 47, which receive the next modules if there is a malfunction. FIG. 3d shows one possible configuration of the modules 45 in the second buffer region with possibility of sorting out defective modules, whereas FIG. 3e is a diagrammatic cross sectional view of the module arrangement with module or magazine cycling for the purpose of achieving the temperature in the region of the second test area 74.

Figure 3F:
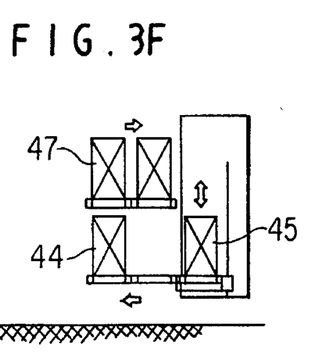

FIG. 3f is a cross sectional view similar to that of FIG. 3d of a possible arrangement of modules with the possibility of sorting out defective modules.

Figure 4A:
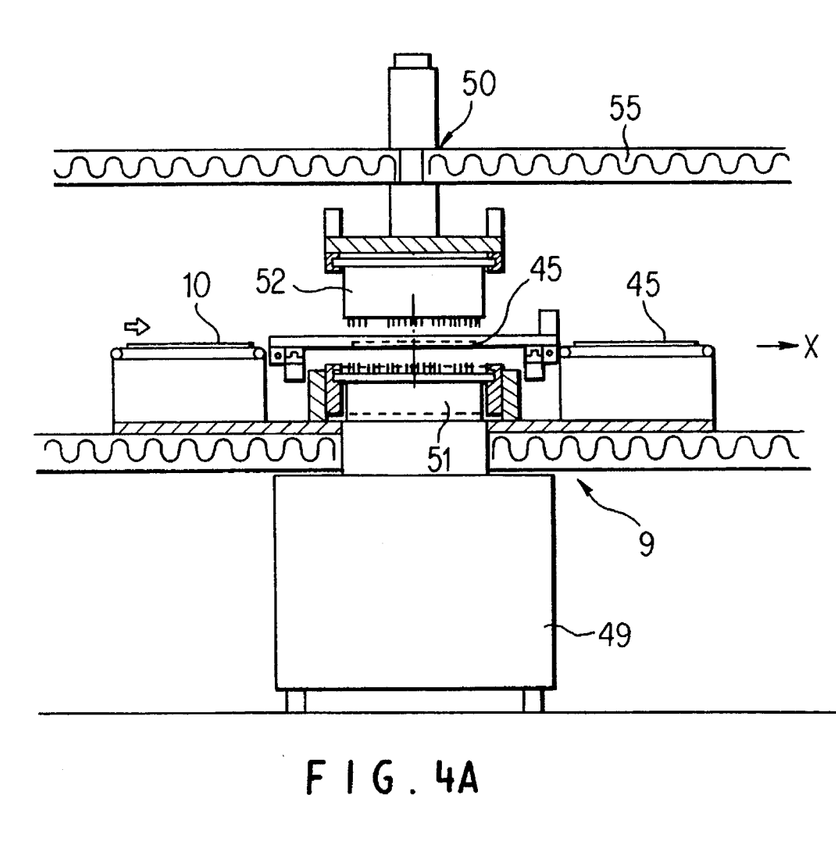
FIGS. 4a and 4b respectively are a longitudinal sectional view and cross sectional view of a test area with tester and appropriate adapter.
Figure 4B:
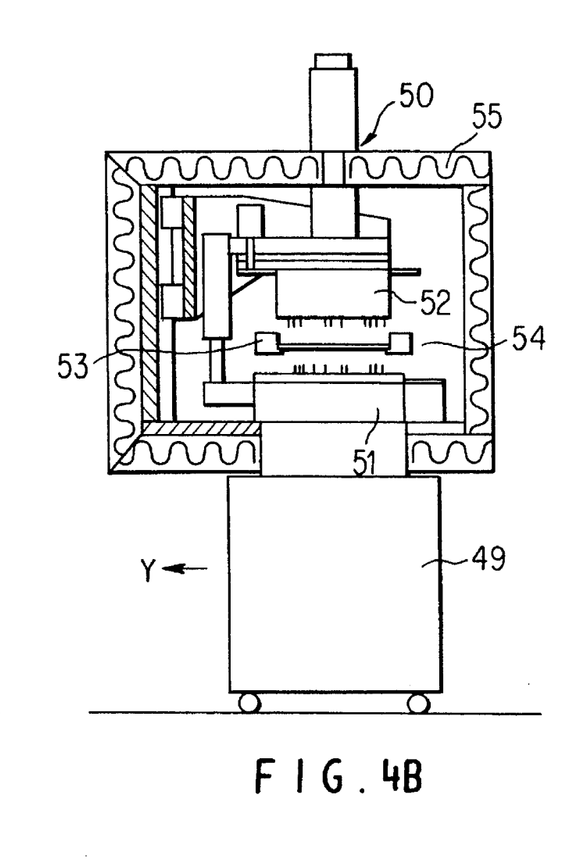

FIG. 4a is a longitudinal view along the X axis of the test station, whereas FIG. 4b is a cross sectional view along the Y axis, from which the adjustability of the module adapter relative to the width of the plate is apparent.

According to FIG. 4a, the modules 45 are fed by means of the conveyor belt element 10 to the test station, where the module 45 is contacted by an upper adapter 52 and a bottom adapter 51, both of which are arranged in one of the thermally insulated first or second test areas. The bottom adapter 51 is electrically and mechanically connected to the first testing device 49 by way of a thermal barrier 68 (shown in FIG. 5) or thermal transfer interface, so that the thermal insulation of the atmospheric region, formed by the buffer region and the first test area, is largely sealed against the exterior environment. The upper adapter 52, which is situated above the module 45, is also conveyed, with the exception of its thermally insulated passage 50, through the insulating layer 55 to the first test area.

FIG. 4b is a cross sectional view of a corresponding construction, where the width adjustment required for different module formats is also taken into consideration. According to FIG. 4b, both the left section 53 with its conveyor belt or conveyor chain can be adjusted in the Y direction, whereas the right section 54 of the conveyor belt or conveyor chain is installed stationarily. The construction and mode of operation of the adapters 51 and 52 correspond in essence to the arrangements known from the literature, as described, for example in U.S. Pat. No. 4,818,933. However, one special feature lies in the fact that owing to the thermal insulation of the first and second test area the bottom adapter 51 is also extensively insulated with respect to heat, due to the thermal barrier, from the testing device 49 operating at room temperature. The construction of such thermal barriers is explained in detail with reference to the adapter, as shown by means of the extractions in FIG. 5.

Figure 5:
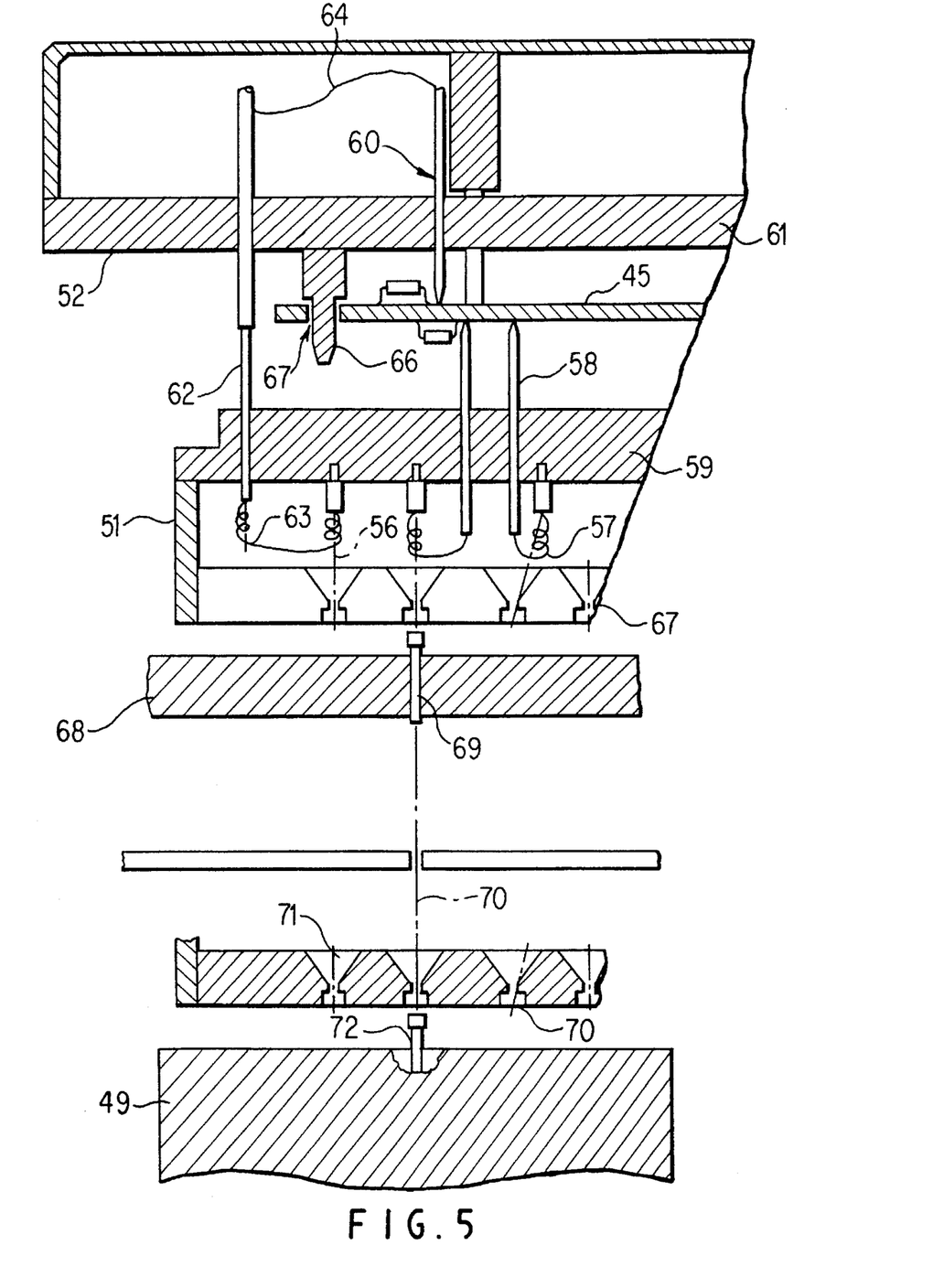
FIG. 5 depicts sections of an adapter, whose interfacing/contacting elements are provided for contacting above and below the module.

According to FIG. 5, the bottom adapter 51 is provided with receiving sockets 56, which are arranged in the shape of a grid and in which are arranged at least some contact elements 57, which are connected electrically to the test pins 58, which are guided through the electrically insulating bottom adapter plate 59. A corresponding test pin configuration can also be arranged in the upper adapter 52, whereby the test pin 60 of the upper adapter is guided through the bottom adapter plate 61 of the upper adapter. The electrical connection is transferred to the upper test pins 60 via contact elements 57, their connection 63 to the transfer test pin 62 and a wire connection 64 to the test pin 60. The contact positions of the module 45 with the positions of the test pins is allocated exactly with the aid of an adjusting pin 66, which reaches into a recess 67 of the module 45. This device is known in principle from U.S. Pat. No. 4,818,933, so that further explanations concerning the adapter and the module are unnecessary. However, it is essential with respect to the high temperature testing in the first test area or the low temperature testing in the second test area that it is possible to thermally uncouple the adapters, which can be thermally stressed and are situated in the respective test area region, and the respective testing device 49. To this end, there is a thermal barrier 68, which is arranged between the grid plate 67 of the bottom adapter 51 and a grid plate situated above the testing device 49 and which is made of a thermally insulating material and enables a small passage of heat on account of adequate space between test station and adapter. The grid plate 67 is attached to the testing device by means of the pins 69, which project beyond the thermal barrier 68 and which are connected via flexible conductors or wires 70 to the receiving sockets 71 of a bottom grid plate, which defines the thermal barrier and into which project the pins 72 that project beyond the test station for the purpose of contact.

Thus, it is guaranteed that a test station functioning in the room temperature range, as known, for example, from U.S. Pat. No. 4,818,933, can also be used for the subject matter of the invention with few modifications for the purpose of erecting a thermal barrier.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. Process for manufacturing and temperature control and in-line testing of printed circuit boards on which component elements in the form of electronic, electromechanical, or mechanical modules or electrical components are fitted as semi-finished products, comprising:

passing said printed circuit boards in succession to a soldering station and subjecting said printed circuit boards to a sufficiently high temperature to make solder electrical connections to said component elements;

reducing the temperature of printed circuit boards emerging from said solder station to a first temperature in a temperature range of −50° C. to 200° C. and, while maintaining said first temperature, subjecting said printed circuit boards to a first test phase for the purpose of determining defective component elements;

subjecting the printed circuit boards having modules recognized to be faultless in the first test phase to heating or cooling to a second temperature in the temperature range of −50° C. to 200° C. and performing a second test phase in which further testing is performed in order to determine defective modules; and feeding those printed circuit boards determined in said first and second test phases to be faultless to a dispenser, and when a printed circuit board is determined in said first and second test phases to include a component element that is defective, removing said printed circuit board having said defective component element from a path to the dispenser; and, outputting an error message indicating that the printed circuit board removed from the path to the dispenser is defective.

2. Process as claimed in claim 1, wherein in the first test phase the modules are temperature controlled to said first temperature ranging from 60° C. to 130° C.

3. Process as claimed in claim 1, wherein in the second test phase the modules are temperature controlled to said second temperature ranging from −50° C. to +25° C.

4. Process as claimed in claim 1, comprising:

specifying a temperature set point value to a controller; and, using said controller to limit a maximum system temperature deviation in space and time in said first and second test phases to a maximum tolerance of ±5 Kelvin from said temperature set point value.

5. Process as claimed in claim 1, comprising:

generating at least one corrective signal for correcting at least one process parameter in response to said error message and sending said corrective signal to a point upstream of the test station at which the defective printed circuit board was detected.

6. Process as claimed in claim 1, comprising:

subjecting a printed circuit board to both a component test and a function test in the first test phase.

7. Process as claimed in claim 1, wherein in the first test phase the modules are temperature controlled to said first temperature ranging from +25° C. to 200° C.

8. Process as claimed in claim 7, wherein in the second test phase the modules are temperature controlled to said second temperature ranging from −50° C. to +25° C.

9. Process as claimed in any one of the claims 1 to 8, comprising:

determining a number of printed circuit boards which are defective in a defined time interval; and, stopping processing of said printed circuit board upstream of said test station when the determined number of defective printed circuit boards exceeds a predetermined number.

10. Process as claimed in claim 1, comprising:

identifying, prior to the first test phase, the printed circuit board to be tested by means of scanning a code provided on each printed circuit board; and, recording all test results obtained for the identified printed circuit board in relation to the scanned code.

11. Process as claimed in claim 10, comprising:

storing each identification code in the memory of a computer;

assigning each test result of a test of an respective printed circuit board that is found to be faultess to the stored identification code; and, terminating testing of a respective printed circuit board when testing indicates that the respective printed circuit board is defective, and assigning the test result indicating a defective printed circuit board to the identification code stored in the memory of the computer.

12. Process as claimed in claim 11, comprising:

analyzing the cause of an error message when a printed circuit board is found to be defective;

returning the printed circuit to the test station in which the error message was produced; and, retesting the printed circuit board at the test station to which it was returned.

13. Process as claimed in claim 10, comprising:

determining the code of the respective printed circuit board prior to the first test phase; and, if a printed circuit board is defective, sorting out the defective printed circuit board, rereading the code of the sorted art printed circuit board, and storing the reread code.

14. Process as claimed in claim 13, comprising:

determining how many times a particular printed circuit board has been sorted out due to being defective; and scrapping said particular circuit board upon determining that said particular circuit board has been sorted out due to being defective a predetermined number of times.

15. System for manufacturing and temperature control and testing of printed circuit boards on which component elements as semi-finished products are fitted, comprising:

a soldering station at which the component elements are mechanically and electrically connected on said printed circuit board;

at least a first test area coupled to said soldering station and receiving printed circuit boards as said printed circuit boards emerge from said soldering station, including, at least a first testing station in said first test area for performing predetermined testing on said printed circuit boards, means for insulating said first test area with respect to heat and atmosphere against an environment associated with the soldering station so that the temperature of the printed circuit boards after emerging from the soldering station is reduced at the first testing station to a temperature in the range of −50° C. to 200° C. at which testing of said printed circuit boards is performed;

a conveying device for conveying printed circuit boards at elevated temperatures from the soldering station to the first test area and from the first test area to outside the first test area; and control means coupled to said first test station and said conveying device for sorting out printed circuit boards determined to be defective in said first test station to a first output sluice in order for the printed circuit boards determined to be defective to issue from the first test area along a first path and for passing non-defective printed circuit boards to a second output sluice to issue from said first test area along a second path.

16. System as claimed in claim 15, further comprising:

a second test area coupled to said conveyor device along said second path, said second test area having a second test station and insulated with respect to heat and atmosphere against the environment;

wherein the first test area has its temperature adjusted to a temperature ranging from 25° C. to 200° C. and the second test area has its temperature adjusted to a temperature ranging from −50° C. to +25° C.

17. System as claimed in claim 15, wherein exiting of the defective printed circuit boards from the first test area to the first path is controlled by said control means.

18. System as claimed in claim 15, 16 or 17, comprising:

a scanning device provided at the first test area preceding the first test station in order to decode a code on respective printed circuit boards to identify said printed circuit boards.

19. System as claimed in claim 18, wherein said control means comprises:

a digital computer having an input coupled to said scanning device, at least one input and at least one control output connected to said first test station, and at least one control output coupled to the conveyor device, for storing results of testing at said first test station and controlling transit of said printed circuit boards from said first test station via said conveyor device to said first and second paths based on results of said testing.

* * * * *